United States Patent [19]

Richardson

[11] Patent Number: 4,925,808
[45] Date of Patent: May 15, 1990

[54] METHOD FOR MAKING IC DIE WITH DIELECTRIC ISOLATION

[75] Inventor: William E. Richardson, Rutland, Mass.

[73] Assignee: Sprague Electric Company, North Adams, Mass.

[21] Appl. No.: 328,211

[22] Filed: Mar. 24, 1989

[51] Int. Cl.$^5$ ............... H01L 21/76; H01L 21/80; H01L 21/86; H01L 29/80

[52] U.S. Cl. ..................... 437/62; 437/65; 437/66; 437/67; 437/227; 437/228; 437/911; 357/56

[58] Field of Search .............. 437/21, 62, 67, 226, 437/227, 228, 911, 65, 66; 357/22, 56

[56] References Cited

U.S. PATENT DOCUMENTS

| 3,381,182 | 4/1968 | Thornton | 317/234 |
|---|---|---|---|
| 3,411,200 | 11/1968 | Formigoni | 437/62 |
| 3,954,522 | 5/1976 | Roberson | 437/62 |
| 3,966,577 | 6/1976 | Hochberg | 437/62 |
| 4,408,386 | 10/1983 | Takayashiki et al. | 156/628 |
| 4,449,284 | 5/1984 | Shimbo | 437/66 |
| 4,501,060 | 2/1985 | Frye et al. | 437/62 |
| 4,567,646 | 2/1986 | Ishikawa et al. | 437/62 |
| 4,638,552 | 1/1987 | Shimbo et al. | 437/62 |
| 4,851,078 | 7/1989 | Short et al. | 156/632 |

FOREIGN PATENT DOCUMENTS

| 58-30141 | 2/1983 | Japan | 437/62 |
|---|---|---|---|
| 58-155739 | 9/1983 | Japan | 437/62 |
| 59-186340 | 10/1984 | Japan | 437/62 |
| 59-186341 | 10/1984 | Japan | 437/62 |
| 59-218748 | 12/1984 | Japan | 437/62 |
| 61-224431 | 10/1986 | Japan | 437/38 |

Primary Examiner—Olik Chaudhuri

[57] ABSTRACT

The method includes forming in one surface of an N+ silicon wafer a matrix of uniformly deep V-shaped grooves, growing one SiO$_2$ over the one surface and the walls of the grooves, forming over the opposite wafer surface a thick self-supporting polycrystalline layer, progressively removing portions of the original silicon wafer until the bottoms of the grooves are detected to leave separate patches of the original N+ silicon wafer material and then growing a thin (e.g. 6 microns) P-doped layer of epitaxial silicon on the exposed N+ silicon layer patch portions now isolated and defined by the grooves. A figure-eight pattern of trenches is formed in each silicon island completely through the P epitaxial layer and each of the underlying N+ buried patches but stopped at the SiO$_2$ layer. An N+ plug is formed through the epitaxial layer to each N+ patch. Metal conductors complete the formation of a JFET transistor in each island bounded and defined by one of the closed loops or annular portions of the figure-eight-patterned trenches. The wafer is then sawed apart along all the V-shaped grooves providing a plurality of IC die, each having two dielectrically isolated JFET transistors.

13 Claims, 2 Drawing Sheets

METHOD FOR MAKING IC DIE WITH DIELECTRIC ISOLATION

BACKGROUND OF THE INVENTION

This invention relates to a method for making semiconductor die, wherein at least two dielectrically isolated islands are created in each of the die and in each of these islands an epitaxial layer is formed having a uniform and predetermined thickness from island to island and from die to die.

Numerous processes have been used to make semiconductor die with dielectrically isolated islands or pockets. Such die are employed in the manufacture of integrated circuits wherein separate transistors are formed in separate of the isolated pockets.

In one such method a system of grooves is formed in a major surface of a silicon wafer being heavily doped with N-type impurities. A silicon dioxide layer is grown over that wafer surface and the surface of the grooves, and a thick self-supporting polysilicon layer is deposited over the silicon dioxide layer. Subsequently, a major portion of the N+ silicon wafer material is mechanically removed by lapping to leave a plurality of shallow N+ islands separated from each other by the aforementioned silicon dioxide layer. A lightly N+ doped silicon is then epitaxially grown over the thin N+ islands. In that step there are simultaneously formed lightly N-doped polysilicon strips over the initially exposed silicon dioxide that is at the bottom of the grooves. This doped polysilicon is not an excellent insulator and is removed by a selective etching step, the resulting holes are filled and the fill material and epitaxial layer patches over the N+ islands are planarized by lapping. These later steps for obtaining good isolation between pockets by removing polysilicon strips, filling and lapping is complex and costly but the last step of lapping is of particular concern because lapping tends to remove some of the epitaxial layer that has an inherently uniform thickness. Lapping is a relatively crude process for removing material and the uniformity of thickness of the as-deposited epitaxial layer patches is thereby degraded.

In another prior art process a lightly N-doped epitaxial layer is grown over a heavily N-doped silicon wafer. A matrix of grooves is formed completely through the epitaxial layer and slightly through the N/N+ interface. Silicon dioxide is grown over the exposed epitaxial material and thereover is deposited a first thick self-supporting layer of polysilicon. The exposed N+ wafer surface is then lapped away to leave thin N+ patches separated by the SiO₂ in the matrix of grooves. The above-noted matrix of grooves separates blocks of the N and N+ silicon layers from each other. An insulating layer is formed over the N+ silicon patches.

Now, in each of the patches of this N+ material a second system of grooves is etched completely through the N+ layer and completely through the N epitaxial layer to divide each P+ patch and associated epitaxial patch into islands bounded by some grooves from both the first and second sets of grooves. A second silicon dioxide layer is grown over the surface of the thin N+ islands and surfaces of the second sets of grooves.

A second thick self-supporting layer of polysilicon is formed over the N+ silicon patches. The first thick self-supporting layer of polysilicon is now removed by lapping until the second silicon dioxide layer covering the epitaxial material is laid bare. Again, this process is complex and costly, and more importantly, uses the crude mechanical lapping process to expose but in this case hopefully not penetrate the second silicon dioxide layer which is difficult to control especially over the entire surface of a wafer-sized workpiece.

It is therefore an object of this invention to overcome the above-noted shortcomings of the prior art.

It is also an object of this invention to provide a non-critical method for making an integrated circuit die having dielectrically isolated islands comprised of a uniformly thick epitaxially grown layer.

It is a further object of this invention to provide a method for making a plurality of die with dielectrically isolated islands of semiconductor material wherein an outer portion of each island is a very thin epitaxial layer of highly uniform thickness from island to island and from die to die.

SUMMARY OF THE INVENTION

A method for making integrated circuit die with dielectric isolation includes forming a network of rows and columns of V-shaped grooves in one surface of a singlecrystal semiconductor wafer to divide the one surface into a plurality of die-surface areas that are each bounded by the grooves. A first dielectric layer is then formed over the one surface and the surface of the grooves. A thick selfsupporting layer of polycrystalline semiconductor material is grown over the first dielectric layer; and then the original semiconductor wafer material is progressively removed until the bottoms of the deeper V-shaped grooves appear. This removal step has the effect of separating the remaining layer of original single-crystal silicon into thin separate patches each of which is circumscribed by the V-shaped grooves.

It is preferred that each row and column be made up of a plurality of short spaced apart tapered grooves or holes having various predetermined widths and therefore depths. The removal by lapping or other means is stopped when the deeper of the grooves all over the wafer surface are revealed. Five predetermined groove depths are preferred.

A thin non-self-supporting epitaxial silicon layer is then grown over the patches of the original silicon wafer. One figure-eight pattern of trenches is now formed through the epitaxial layer and further through each patch of the original silicon wafer material. This step preferably includes doping the epitaxial layer during its formation with impurities of either polarity type but of a different concentration than the impurity concentration in the original single-crystal wafer; this results in a difference in impurity density in the epitaxial layer and the underlying silicon patches which is useful in making a variety of transistors, i.e. silicon JFET with a buried silicon gate, NPN transistor with a N+ collector portion, etc.

Subsequently, in each of the die surface areas a figure-eight pattern of trenches is formed completely penetrating both the silicon epitaxial layer and the underlying silicon patch to define between the rows and columns of grooves two spaced apart silicon islands each bounded entirely by part of the pattern of trenches. The wafer is separated by the V-shaped grooves to produce a plurality of individual die in which is provided two dielectrically isolated islands.

Because a clearer portrayal of the invention can be made by describing it in terms of a silicon semiconductor material, and because silicon is the material of choice in the preferred embodiment, the method of this invention cites silicon only. However, this invention is meant to also include other semiconductor materials including germanium, III-V compounds such as gallium arsenide.

This invention exploits the fact that thin epitaxial layers in the thickness range of from 1 to 10 microns still have an inherently uniform initial thickness over a large wafer surface, and that the epitaxy step can produce a target thickness in that range within about ±15% of the target value.

It is further recognized that any step subsequently used that will reduce the epitaxial layer thickness will introduce relatively large variations in thickness over a wafer surface. Thus the method of this invention is particularly well suited for making transistors which require a uniform thin epitaxial layer (i.e. not exceeding about 10 microns) such as some JFET's, low voltage bipolar transistor switches and the like.

These drawings depict the relative positions of features of the product at various stages of manufacture but are not drawn to scale, mainly owing to a magnified vertical scale relative to the lateral scale.

DESCRIPTION OF THE PREFERRED EMBODIMENT

Figure 1:
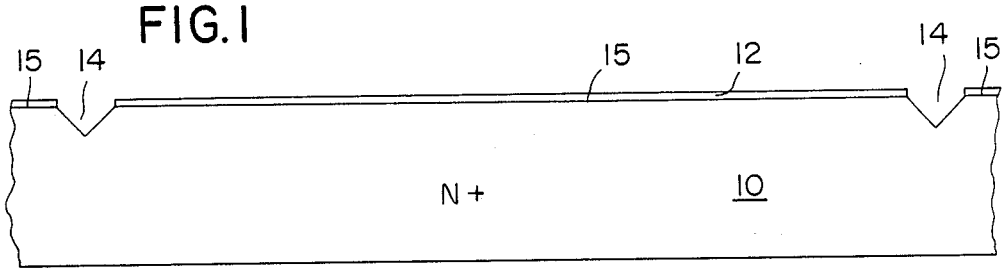
FIG. 1 shows in side sectional view a portion of a single-crystal silicon wafer having a system of V-shaped grooves formed therein.

A single-crystal silicon wafer 10 with major surfaces in the 100 plane is heated to grow a layer 12 of silicon dioxide on one of the major wafer surfaces. In a conventional photolithographic masking step, a photoresist mask is formed over the oxide layer 12 which mask has a matrix of spaced apart slit openings having different widths, through which the exposed wafer surface is etched using a standard isotropic etch. This etching takes place along sloped silicon-crystal planes to form tapered holes, otherwise identified as short V-shaped grooves 14 of different depths associated, respectively, with the mask openings of different widths. Etching stops when the bottom of the larger grooves is reached. The depth of a hole, or short groove, is determined by the width of the photoresist mask slot openings which are preferably made of predetermined width expressly for controlling groove depth. Thus lines of short grooves of a variety of predetermined depths is formed, and these lines of short grooves form a network of columns and rows that encompasses and defines a plurality of separate wafer surface areas 15 as shown in FIG. 1. The photoresist mask is removed.

Figure 2:
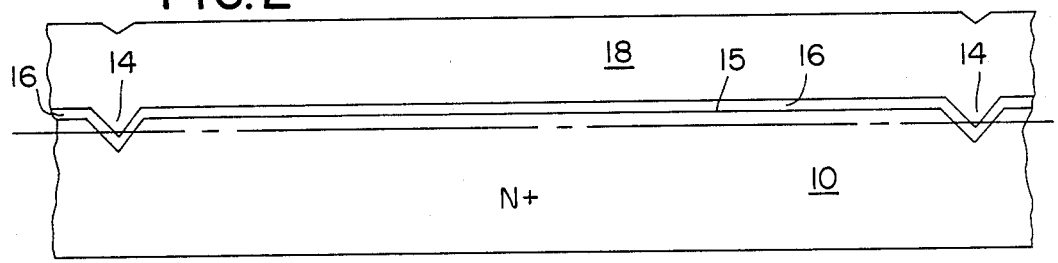
FIG. 2 shows in side sectional view the wafer portion of FIG. 1 having a thin oxide layer and a thick polysilicon formed over a major face of the wafer.
Figure 3:
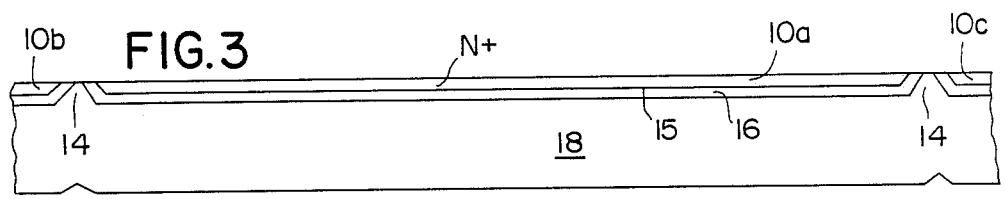
FIG. 3 shows in side sectional view inverted, the wafer portion of FIG. 2 with most of the single-crystal removed.

Silicon dioxide layer 12 is stripped away and a new $SiO_2$ layer 16 is grown over the separate wafer surface areas and over the surfaces of the grooves 14. A layer of polysilicon 18 is then deposited over that $SiO_2$ layer 16 as illustrated in FIG. 2. This polysilicon layer 18 is made thick enough, e.g. about 20 mils, that is self-supporting: namely, that by itself it will not readily break during handling.

In a next step, almost all of the original silicon wafer 10 is removed mechanically, e.g. by lapping, leaving thin patches of silicon 10a, 10b, etc. that are bounded and defined by the matrix of V-grooves 14. This is accomplished by stopping the lapping when the bottoms of the larger grooves 14a become visible over the entire surface of the wafer and none of the shallower grooves 14c show. It will be appreciated that the V-shaped grooves 14 of at least three predetermined depths serve in the lapping step as lapping depth gauges across the entire surface of the wafer. Thus the thickness of the remaining N+ silicon patches 10a, 10b, etc. are easily controlled so that none of them are completely removed and the thickest of them is thinner than the original depths of the larger grooves 14a and thicker than the depth of the smallest grooves 14c everywhere on the wafer. FIGS. 6, 7, 8 and 9 show only three predetermined groove depths for clarity but five provide a more accurate lapping depth gage.

Figure 4:
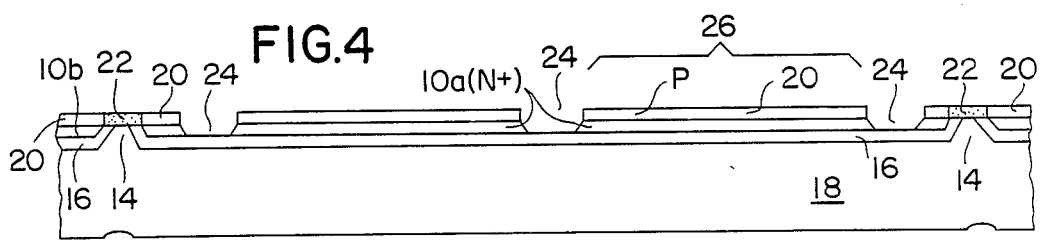
FIG. 4 shows in side sectional view the wafer portion of FIG. 3 with an epitaxial layer added thereto and having another system of grooves formed at the opposite major surface of the wafer.

Referring now to FIG. 4, a layer 20 of silicon is epitaxially grown over the N+ single-crystal silicon patches, e.g. 10a, by a standard silane vapor deposition step. Epitaxy is inherently capable of producing a highly uniform layer, e.g. epitaxial layer 20. Variations across the wafer of layer 20 are typically within ±0.1 micron. The vapor at epitaxy also contains a small quantity of a P-type impurity, e.g. boron to provide a lightly doped epitaxial layer 20.

Also formed during epitaxy are polysilicon plugs 22 over the exposed $SiO_2$ layer 16 and exposed polysilicon 18, if any is exposed, at the lapped-off bottoms of "depth-gauge" grooves 14. Although these plugs are only slightly conductive, owing especially to the P-type impurities in the epitaxy vapor and also to the heavily N-doped polysilicon 18 that may have been exposed by the lapping, they are not relied upon as part of a high quality dielectric isolation system between the IC components to be described below.

Figure 5:
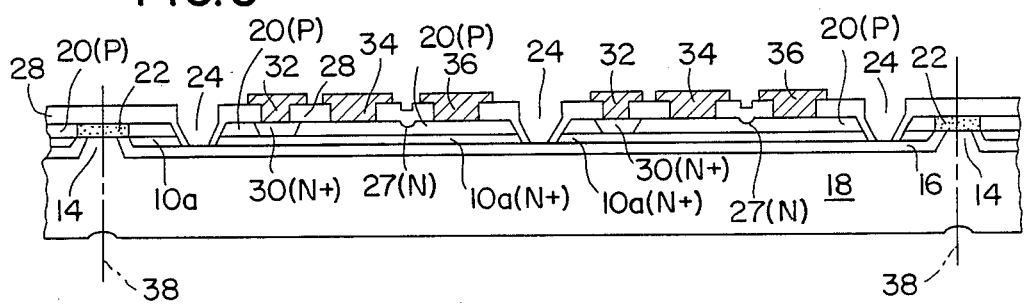
FIG. 5 shows in side sectional view taken in plane 5—5 of FIG. 6 two JFET transistors formed respectively in the two islands of silicon defined by the second system of grooves in the wafer of FIG. 4.
Figure 6:
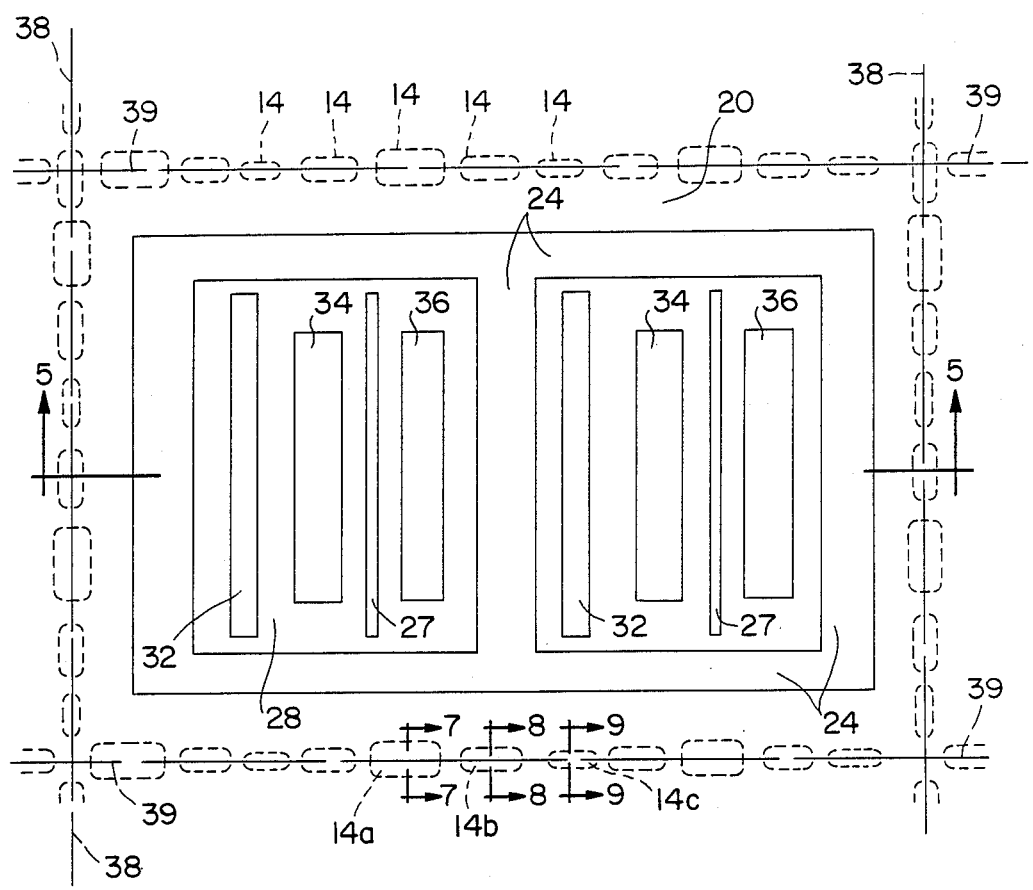
FIG. 6 shows in top view the wafer portion of FIG. 5.
Figure 7:
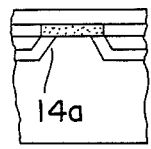
FIGS. 7, 8 and 9 show in sectional views a group of three short grooves that have different widths and depths, such groups repeating to form the four rows and columns of short grooves shown in FIG. 6.
Figure 8:
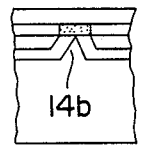
Figure 9:
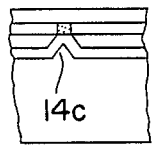

A second photoresist mask, not shown, is now formed over the epitaxial layer 20 and plugs 22. This mask is characterized by having uniformly wide openings or slots which form a plurality of spaced apart figure-eight patterns. Two of the figure-eight patterns are positioned over each N+ patch, e.g. 10a. Selective etching of the underlying silicon ensues through the slots of this second mask. The width of the mask slots is large enough to ensure that the resulting V-shaped trenches 24 completely penetrate both the P-epitaxial layer 20 and the buried N+ patches, e.g. 16a, as seen in FIG. 5. The V-shaped trenches 24 form one figure-eight pattern over each patch 20 as illustrated in FIG. 6. Each figure-eight pattern of trenches 24 isolates a silicon island 26 comprised of a portion of the outer P-type epitaxial silicon layer 20 and the buried N+ patches, e.g. 10a.

The second mask is removed and a third mask is formed with an elongated opening over each trench-isolated portion of epitaxial layer 20. Through these openings a heavy dose of impurities of the N-type are introduced to form an N+ contact region 30 through epitaxial layer 20 to the N+ patches 16. After removal of the third mask a fourth mask is provided through which N conductivity impurities are introduced to form a N+ barrier strip 27 near the outer surface of each portion of the epitaxial layer 20 lying within each annular trench pattern. The fourth mask is now removed and a third silicon dioxide layer 28, or other insulating layer, is formed over the epitaxial layer surface and the surfaces of the trenches.

Using a fifth mask, holes are opened in the third silicon dioxide insulating layer over the N+ layer contact regions 30. After removing the fifth mask, a blanket layer of aluminum is vacuum deposited over the third $SiO_2$ layer and a sixth mask is used to selectively remove aluminum metal providing separate metal conductors 32, 34 and 36, respectively for making circuit connection to the N+ contact region 30, for forming a Schottky source and a Schottky drain on either side of each N-type barrier 28 to complete formation of a JFET transistor in each dielectrically isolated island, e.g. 26, wherein a buried N+ patch, e.g. 10a, serves as the gate.

A glass passivation layer (not shown) may be deposited over the oxide layer 28 and the metal conductors 32, 34 and 36. The wafer is then divided into a plurality of individual die by sawing along the grooves 14, e.g. in the planes 38 and 39 as shown in FIGS. 5 and 6. The wafer surface area devoted to the lapping-depth-gage grooves 14 is therefore about the same as is allocated to the kerf of the cut between die resulting in efficient use of wafer area. Two matched parameter JFETs are thus provided in each die.

The value of this invention for making integrated circuits with dielectrically isolated islands with their epitaxial layers is best considered in light of the fact that the most precise mechanical semiconductor removal process, lapping, typically can provide a lapped thickness tolerance across a wafer of ±5 microns. Also pertinent is the experience using this invention of actually achieving an epitaxial layer thickness of 2±0.25 microns from die to die and from wafer to wafer. The importance of holding such close tolerances is appreciated from the fact that FET transistors made according to the method of this invention using 1 ohm-cm epitaxial material, exhibit pinch off voltages of 4 volts and 500 volts, respectively, for epitaxial layer thickness of 1 micron and 10 microns. Likewise, though not as dramatic, $BV_{sat}$ in a bipolar transistor is inversely related to epitaxial layer thickness.

What is claimed is:

1. A method for making integrated-circuit die with dielectric isolation comprising:
   (a) forming a network of rows and columns of V-shaped grooves in one major surface of a single-crystal silicon wafer to divide said surface into a plurality of die-surface areas, each being bounded by said grooves;
   (b) forming a first dielectric layer over said one surface and the walls of said grooves;
   (c) depositing a thick polysilicon layer capable of being self-supporting over said first dielectric layer;
   (d) progressively removing original strata of said single-crystal silicon wafer at the opposite major wafer surface until a bottom portion of said grooves is also removed revealing patches of a thin non-self-supporting layer of said single-crystal silicon wafer between said rows and said columns, so that said patches are supported by said dielectric layer that is in turn supported by said polysilicon layer;
   (e) growing a silicon epitaxial layer over the exposed surface of said single-crystal silicon patches;
   (f) forming in each of said die-surface areas trenches in a figure-eight pattern that penetrate completely through both said silicon epitaxial layer and the underlying of said silicon patches to create two spaced apart silicon islands, each bounded entirely by said trenches;
   (g) forming a dielectric layer over said epitaxial layer and the walls of said trenches; and
   (h) separating said wafer along the center lines of said grooves to produce a plurality of die each having two dielectrically isolated silicon islands.

2. The method of claim 1 wherein said growing said epitaxial layer is stopped before the thickness of said epitaxial layers exceeds 9 microns.

3. The method of claim 1 wherein said one major surface of said wafer is in the 100 silicon crystal plane.

4. The method of claim 3 wherein said forming said V-shaped grooves is accomplished by forming a first mask having apertures positioned over regions of said one wafer surface at which said grooves are to be formed, and selectively isotropically etching through said apertures so that said etching is self-stopped when said V-shaped grooves are completely formed.

5. The method of claim 1 wherein said grooves in each said column and row, consist of a series of spaced apart short grooves.

6. The method of claim 5 wherein said first mask apertures are organized in groups of from 3 to 5 apertures having different predetermined widths, said subsequent isotropically etching leading to different self-stopped depths of a group of corresponding of said short grooves after said isotropic etching.

7. The method of claim 6 wherein said removing is stopped after the largest of said short grooves but not the shortest of said grooves in said groups of grooves over the entire surface of said wafer have been revealed by said removing.

8. The method of claim 1 wherein said separating said wafer is accomplished by sawing.

9. The method of claim 1 wherein said mechanically removing is accomplished by lapping.

10. The method of claim 1 wherein said single-crystal silicon wafer is heavily doped with impurities of one polarity type, and said growing said epitaxial layer includes doping said epitaxial layer with impurities of the other polarity type.

11. The method of claim 10 additionally comprising forming two essentially identical JFET transistors, respectively, in said two silicon islands wherein said heavily doped silicon patch in each island serves as the gate.

12. The method of claim 10 wherein said forming said JFET transistors is accomplished simultaneously for each of said transistors by forming a gate-contact plug region through said epitaxial layer portion in each said island by selectively doping with impurities of the one type, forming a metal ohmic contact via said plug to said thin silicon patch serving as the transistor gate and forming a metal Schottky source contact and a metal Schottky drain contact through spaced apart holes in said silicon dioxide layer to said epitaxial layer surface.

13. In a process for making an integrated semiconductor circuit of the kind including forming in one surface of a single-crystal semiconductor wafer a network of rows and columns of uniformly deep grooves, forming one insulating layer over said one surface and over the walls of said grooves, forming over the opposite wafer surface a thick self-supporting polysilicon layer, progressively removing portions of said single-crystal semiconductor material until the bottoms of at least portions of said grooves are removed and growing a thin epitaxial layer over the remaining exposed single-crystal material, the improvement comprising:

(a) forming at each patch of said epitaxial layer delineated by adjacent of said rows and columns, a figure-eight pattern of trenches completely through said epitaxial layer and said single-crystal semiconductor material, but not through said one insulating layer so that two islands made up of portions of said semiconductor material and said epitaxial layer are each separated by and surrounded by said trenches;

(b) forming another insulating layer over said epitaxial layer portions and the walls of said trenches;

(c) forming a transistor in each of said two semiconductor islands; and (d) separating said wafer along said grooves to produce individual die with two dielectrically isolated semiconductor islands.

* * * * *